United States Patent
Woloszyn et al.

(10) Patent No.: US 6,770,494 B1
(45) Date of Patent: Aug. 3, 2004

(54) PROCESS OF COMPENSATING FOR LAYER THICKNESS BY DETERMINING DEVICE PARAMETERS ON DIFFERENT SURFACE AREAS OF A SUBSTRATE

(75) Inventors: Jason Woloszyn, Westbrook, ME (US); Michael Harley-Stead, Portland, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/342,634

(22) Filed: Jan. 15, 2003

Related U.S. Application Data

(60) Provisional application No. 60/349,459, filed on Jan. 18, 2002.

(51) Int. Cl.[7] .............................................. H01L 21/66
(52) U.S. Cl. ......................... 438/14; 438/216; 438/275; 257/E21.53
(58) Field of Search ...................... 257/E21.53; 438/14, 438/216, 275; 451/6, 8, 41, 288

(56) References Cited

U.S. PATENT DOCUMENTS

| | | |
|---|---|---|
| 5,965,941 A | 10/1999 | Weling et al. |
| 6,054,362 A | 4/2000 | Chuang |
| 6,159,073 A * | 12/2000 | Wiswesser et al. |
| 6,259,115 B1 | 7/2001 | You et al. |
| 6,265,315 B1 | 7/2001 | Lee et al. |
| 6,301,009 B1 | 10/2001 | Tinker |
| 6,323,982 B1 | 11/2001 | Hornbeck |

OTHER PUBLICATIONS

Chang, E. et al., Using a Statistical Metrology Framework to Identify Systematic and Random Sources of Die- and Wafer-level ILD Thickness Variation in CMP Processes, IEEE, 1995.

Stine, B. et al., Rapid Characterization and Modeling of Pattern-Dependent Variation in Chemical-Mechanical Polishing, IEEE Transactions on Semiconductor Manufacturing, 1998, pp. 129–140, vol. II, No. 1.

Liu, G. et al., Chip-Level CMP Modeling and Smart Dummy for HDP and Conformal CVD Films, SemiWorld Journal, vol. 5.

* cited by examiner

*Primary Examiner*—Fetsum Abraham
(74) *Attorney, Agent, or Firm*—Cesari and McKenna, LLP; Edwin H. Paul, Esq.

(57) ABSTRACT

Chemical mechanical polishing (CMP) produces thickness variations over the surface of a chip or die that depends on many factors. The present invention provides for characterization of the thickness variations over the surface area, and accepting these variations in the detailed design of the components that are to be distributed over the entire surface of the die. Any device with parameters that depend on the layer thickness that is subject to CMP will have variations in those parameters depending upon where the device is located on the die. The present invention characterizes the thickness variations and modifies the physical design of other mechanical aspects of the device so as to compensate for the thickness variations. The result is devices that have acceptable parameters regardless of their location on the chip.

14 Claims, 3 Drawing Sheets

CONTOUR MAP OF EXPERIMENTAL DATA
ACROSS MIRROR ARRAY

IDENTIFICATION OF MIRROR DENSITY GROUPS

CONTOUR MAP OF EXPERIMENTAL DATA
ACROSS MIRROR ARRAY

PROCESS OF COMPENSATING FOR LAYER THICKNESS BY DETERMINING DEVICE PARAMETERS ON DIFFERENT SURFACE AREAS OF A SUBSTRATE

CROSS-REFERENCE TO RELATED APPLICATIONS

The present application claims the benefit of U.S. Provisional Patent Application Serial No. 60/349,459, which was filed on Jan. 18, 2002, of common inventorship and title as the present invention, and the provisional is hereby incorporated herein by reference.

BACKGROUND OF THE INVENTION

1. Field of the Invention

The present invention relates to characterizing and accommodating chip planarity or surface flatness profile across a die or chip. More particularly, the present invention relates to accommodating the flatness profile in a product or device design.

2. Background Information

Experimental data and available literature identify and verify that chemical mechanical polishing (CMP) across a die results in a non-uniform thickness profile. The non-uniformity depends on the polish recipe and the device layout. More specifically, regarding device layout, the device density, aspect ration, area, and pitch, inter alia, contribute to this non-uniform thickness.

The thickness of a film layer, say an oxide, on a die that is subject to CMP can be measured where the variations in the film thickness can be correlated and reproduced as a function of device layout. Here the density (referred to as "loading" in the art) of the devices and the area of the raised structures in the immediate area will affect the oxide thickness. It is well documented in the literature associated with this art that where the density of structures is lower the removal rate of oxide is greater resulting in relatively thinner oxide layer. This effect is illustrated with the Preston equation where the removal rate (RR) is equal to the Preston coefficient (K) multiplied by the pressure (P) and the relative velocity (V), or RR=KPV. Pressure is higher in lower density areas of a chip and accordingly the RR is higher.

One known approach, suggested by the density observation above, is to increase the number of structures across a chip to make the loading uniform. In this case the RR will be more uniform, but at the expense of using valuable chip space with non-functioning or dummy structures. Another limitation of this technique is that the loading near the edges and corners of the chip remains lower than the center of the chip due to the form factor, and so the thickness at the perimeter of the chip will still be thinner than at the center. Moreover, devices at the perimeter may still be unusable.

Another approach is to design specific polish recipes for particular devices and layouts, but this is cumbersome and inefficient in practical production processes.

The use of dummy structures, mentioned above, to compensate for non-uniformity is disclosed in a number of U.S. patents. For example, U.S. Pat. Nos. 6,265,315; 6,259,115; 6,054,362; and 5,965,941. All share the limitation of consuming chip space with non-functioning device.

A technical paper entitled, *Impact of CMP ILD Thickness Variation on Interconnect Capacitance and Circuit Performance*, by Nakagawa et al., Feb. 13–14, 1997 at the CMP-MIC conference, describes a modeling process and technique to predict CMP variations. Such techniques may be used in conjunction with the present invention as described below, and this paper is incorporated by reference herein.

Another prior art technical article is entitled, *Using a Statistical Metrology to Identify Systemic and Random Sources of Die and Wafer Level ILD Thickness Variations in CMP Processes*, by Chang, E et al., 1995 at the International electron Devices Meeting. This article suggests using a statistical metrology framework to characterize CMP variations, to improve process control and interconnect simulation for designing robust circuits. This framework can be used for predicting circuit performance variations caused by layout factors and CMP variations across the chip.

The above references suggest approaches to minimize but not eliminate the thickness variations across a chip. None provide or suggest a solution to the reduced device yields due to the limitations of thinner layers near the edges of chips.

SUMMARY OF THE INVENTION

The present invention addresses the limitations in the prior art by providing for the characterizing of CMP thickness variations across a chip and accepting these variations as design factors used to optimize a device's performance across the entire surface of a chip. The present invention provides an approach that eliminates or substantially reduces the loss of devices near the edges of a die or chip and thus improves the yields of the devices on a chip.

The problem of the prior art is discussed with respect to a chip, but the present invention provides advantages for systems that may use entire wafers.

In a preferred embodiment, the angle of mirrors fabricated on to a chip surface when latched into position is a function of the thickness of usually an oxide layer. However, by characterizing the thickness variations on the chip the distances from the upright support to the mirror hinge may be selected to form an array of mirrors across a chip all with an acceptably equal angle.

In yet other preferred embodiments of electronic components where thickness are important, for example capacitors, other parameters may be selected, for example plate area of capacitors, so that equal value capacitors are produced regardless of location on a chip.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
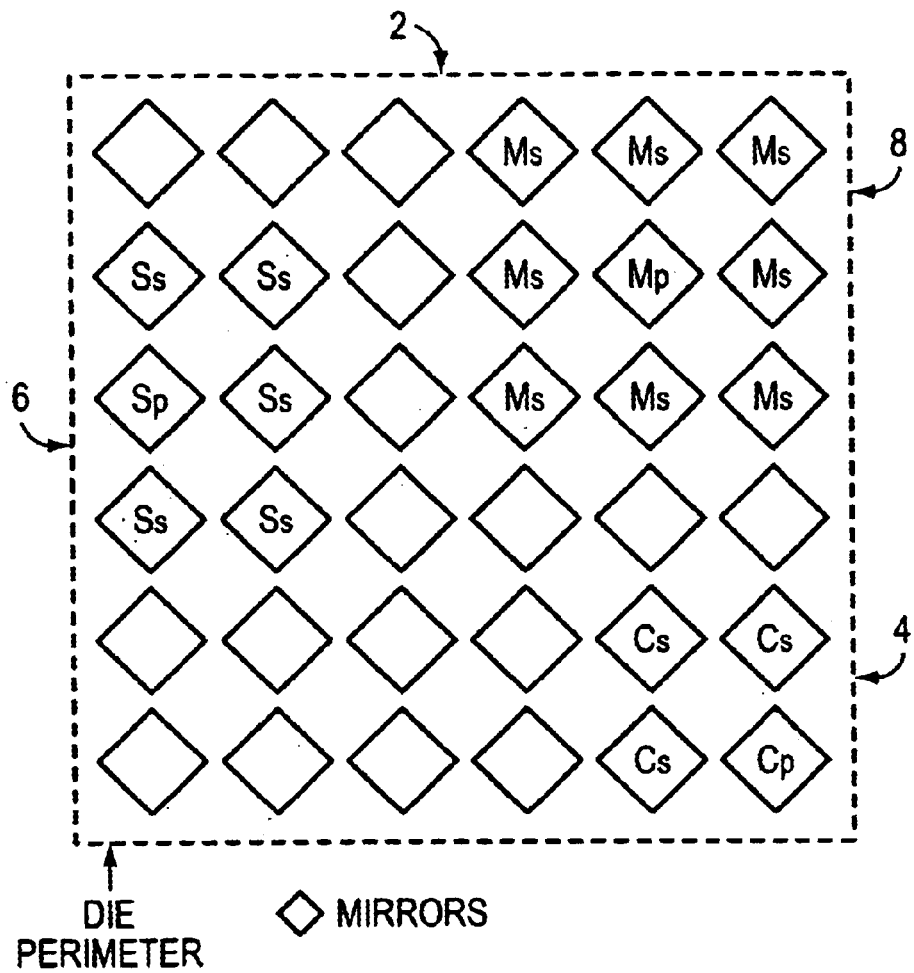
FIG. 1 is a schematic layout of a mirror laden chip.

FIG. 1 shows a die or chip 2 supporting a micro-mirror array with three groups, 4, 6 and 8. The first group 4 is located in the lower right corner of the array. Inspection shows that mirror Cp has only three nearest neighbors Cs. The second group 6 is located along an edge of the array but not at a corner. In this group mirror Sp has five nearest neighbors Ss. The last group 8 represents all the other mirrors in the array that are not at any corner or any edge. In this group mirror Mp has eight nearest neighbors Ms.

Figure 2:
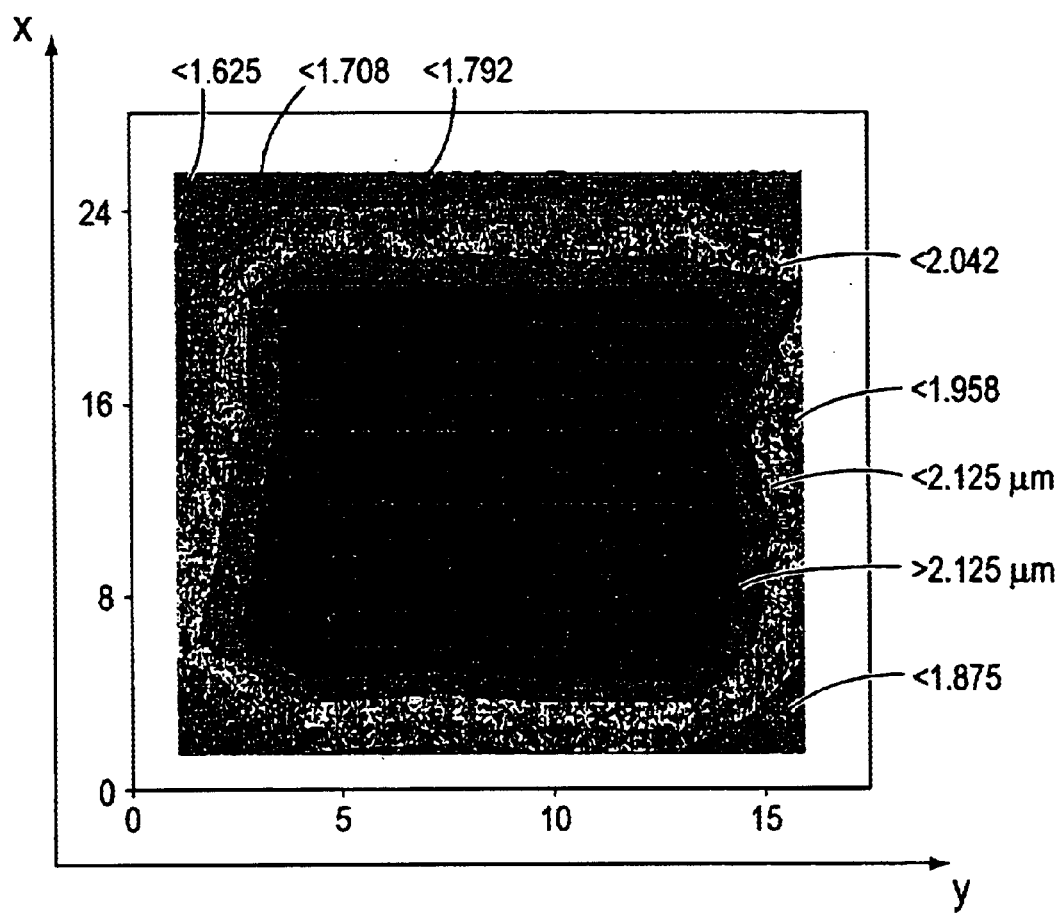
FIG. 2 is a map of the thickness profile on a typical chip after CMP.

FIG. 2 is a contour plot of the top layer oxide thickness measured across the chip/mirror array of FIG. 1. As evidenced from FIG. 2, the thickness at the corners, correlating to mirrors Cp of FIG. 1, is thinnest; the thickness at the sides, corresponding to Sp, are thicker; and the thickness at the center, corresponding to Mp, is thickest. Thicknesses range from less than 1.625 um at two corners to about 1.875 um at the edges and greater than 2.125 um at the center. It is noted that the corners and edges are significantly thinner, e.g. about 25% at the corners and about 10% at the edges.

It is evident that such thickness variations will decrease chip device yields for many devices with properties dependent on this oxide layer thickness. One case in point is the mirror array of FIG. 1. As evidenced in FIGS. 1 and 2, those mirrors at the corners especially and also those mirrors at the edges of the chip are in danger of being non useable. In this instance the final latched angle of the mirrors depends on the local oxide thickness and so may not meet the required angle specifications for use.

Figure 3A:
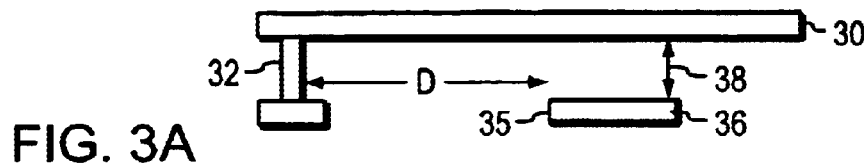
FIGS. 3A–3D are pictorials showing thickness variations affecting mirror angles.

FIGS. 3A, B, C and D illustrate the problem in a distorted pictorial fashion with respect to one mirror of the mirror array of FIG. 1. FIG. 3A shows the arrangement before latching. The mirror support beam 30 lies at a distance D from a flexible hinge 32, and the support beam 30 rests on an oxide layer that was subjected to CMP, this oxide lying on a latch structure 36. When the latch 36 is rotated around a pivot 35 to engage and latch the mirror support beam 30, the angle of the latch and therefore the angle of the mirror support beam and therefore the angle of the mirror itself depends on the distance between the latch 36 and the mirror support beam 30 and the vertical distance 38 between the latch and the support beam. The distance 38 is determined by the thickness of the oxide layer subjected to CMP.

The rotation of the latch 36 by electrostatic attraction addressed over the die surface is well known in the art, as is the latching mechanism.

Figure 3B:
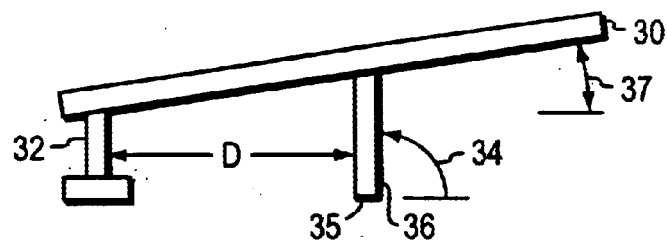
Figure 3C:
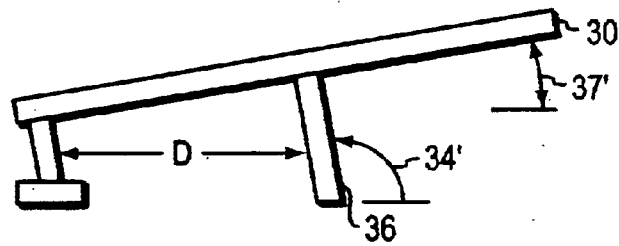
Figure 3D:
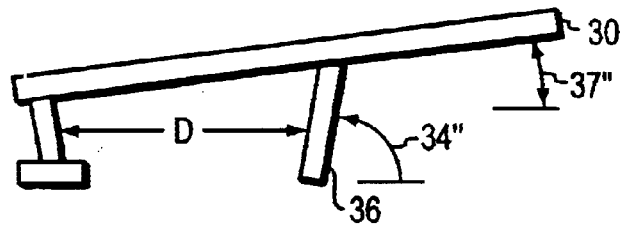

When the oxide thickness is at design center, as in FIG. 3B, the latch rotates through an angle 34 of ninety degrees, and the angle of the mirror support beam is 37. But if the oxide layer is thinner, as shown in FIG. 3C by being at an edge or a corner of the chip, the latch 36 must move through an angle 34' that is greater than ninety degrees before the support beam is latched. In this case the mirror support beam angle 37' will be greater than angle 37 and the resulting mirror support beam angle be non-useable. In a similar fashion, when the oxide layer 38 is too thick, as in FIG. 3D, the latch 36 rotates 34" less than ninety degrees, and again the mirror support beam angle 37" will be less than angle 37 and may render the mirror unusable.

Figure 4:
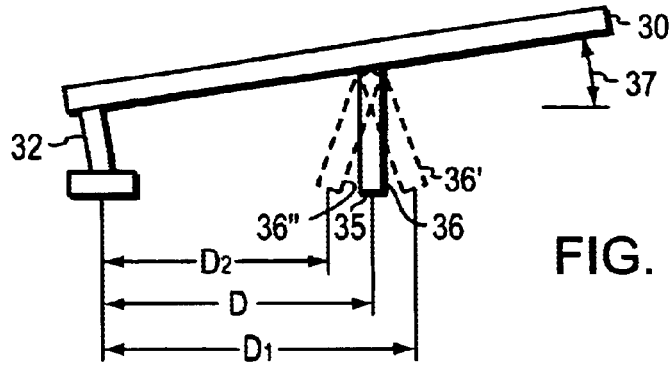
FIG. 4 is a pictorial diagram of a preferred embodiment of the present invention.

FIG. 4 further illustrates a preferred embodiment of the present invention. Here the distance from the hinge to the pivot 35 of the latch 36 is changed to compensate for the thickness profile of the oxide layer. The latch 36 is the design center location as shown in FIG. 3B above where the pivot 35 is at a distance D from the hinge 32. The support beam rests at the angle 37 of FIG. 3B. At a corner or edge of the chip, where the oxide thickness is less than at the center, for example, the distance D1 is made proportionally greater than D so to compensate for the thinness and the latch 36' rotates through more than ninety degrees, but the mirror support beam 30 rests at the same angle 37. If the oxide is thicker, the pivot point for latch 36 is moved closer D2 to the hinge 32, and although the latch rotates through an angle less than ninety degrees, the mirror support beam remains at angle 37.

The present invention is applicable to other designs where the thickness of the CMP oxide layer affects the structure parameters. For example, the value of a parallel plate capacitor is a function of the plate area divided by the plate separation. So, if the dielectric of the capacitor is an oxide layer subject to CMP, the capacitor value will change in a predictable way. In this case the dimensions of the capacitor plates can be modified to compensate for the dielectric thickness variation. In this example the thinner dielectric can be compensated for by smaller plate sizes, as is well known in the art. Moreover, the design of other circuit components, e.g. resistors, can be changed to accommodate the changed capacitor value. In a similar fashion, several different aspects of a device may be modified simultaneously where the combined effect is to compensate for the thickness variation over the chip's surface.

In another preferred embodiment, the thickness variations of a device may be compensated for by modifying processing steps. For example, masking different portions of the chip and providing different diffusion rates and/or times or materials or concentrations, as known in the art may be used to compensate for layer thickness changes due to CMP as described herein.

In a similar fashion, virtually any device whose parameters affect the yield of the devices and where those parameters depend on a layer subjected to CMP processing can benefit from the present invention.

Other devices that depend upon coupling via the oxide layer thickness, or other characteristics like noise cross talk levels that depend on the oxide layer thickness will find advantageous application of the present invention.

What is claimed is:

1. A process for compensating for layer thickness variations of devices disposed over the surface of a die, the process comprising the steps of:

characterizing the layer thickness variations over the surface of the die, determining the location of at least one device on the surface of the die, first associating at least one device parameter with the thickness of the layer, second associating the at least one device parameter with at least one second parameter of the device, modifying the at least one second parameter, with respect to the layer thickness variation at the location of the at least one device, to compensate the at least one device parameter for the thickness variation.

2. The process of claim 1 wherein the at least one second parameter is a mechanical dimension of the device.

3. The process of claim 1 wherein the at least one second parameter is a processing step used in the building of the device.

4. The process of claim 1 wherein the device is an electronic component further comprising the step of modifying another electronic component to compensate for the thickness variation.

5. A device at a location on the surface of a chip made by the process of claim 1.

6. A device at a location on a die, wherein the device has at least one parameter dependent on a die layer thickness that varies over the surface of the die, the device comprising:

means for characterizing the layer thickness variations over the surface of the die, means for determining the location of at least one device on the surface of the die, means for first associating at least one device parameter with the thickness of the die layer, means for second associating the at least one device parameter with at least one second parameter of the device, and means for modifying the at least one second parameter, with respect to the layer thickness variation at the location of the at least one device, to compensate the at least one device parameter for the thickness variation.

7. The device of claim 6 wherein the parameter dependent on layer thickness is a physical dimension or/and orientation in space.

8. The device of claim 6 wherein the device is a mirror.

9. The device of claim 6 wherein the parameter dependent on layer thickness is an electrical property.

10. The device of claim 6 wherein the device is a capacitor, and wherein the at least one device parameter is the at least one parameter dependent on a die layer thickness is the distance between the plates of the capacitor, and wherein the at least one second parameter is the area of the plates.

11. The micro-mirror of claim 6 wherein the means for modifying modifies the location of the support.

12. The micro-mirror of claim 6 wherein the means for modifying modifies the distance between the pivot point and the hinge.

13. The micro-mirror of claim 6 further comprising a plurality of such micro-mirrors distributed over the surface of the die.

14. A micro-mirror located on the surface of a die comprising:

a hinge joining the mirror to the die, wherein the mirror rotates about the hinge to a deflection angle, a rotatable support located under the mirror and arranged to deflect the mirror when the support is rotated, the rotatable support defining the length of the support, a pivot point about which the support rotates, and a distance between the pivot point and the mirror hinge, means for characterizing the oxide layer thickness over the surface of the die, means for determining the location of the mirror on the die, means for first associating the deflection angle of the mirror with the thickness of the die layer at the location of the mirror, means for modifying the length of the support, with respect to the layer thickness variation at the location of the at least one device, to compensate the deflection angle for the oxide thickness variation.

* * * * *